United States Patent
Ito

(10) Patent No.: US 7,557,669 B2
(45) Date of Patent: Jul. 7, 2009

(54) VOLTAGE CONTROLLED OSCILLATOR AND ITS CONTROL METHOD

(75) Inventor: Seiichi Ito, Minato-ku (JP)

(73) Assignee: NEC Corporation, Tokyo (JP)

( * ) Notice: Subject to any disclaimer, the term of this patent is extended or adjusted under 35 U.S.C. 154(b) by 102 days.

(21) Appl. No.: 11/863,771

(22) Filed: Sep. 28, 2007

(65) Prior Publication Data

US 2008/0088382 A1   Apr. 17, 2008

(30) Foreign Application Priority Data

Oct. 13, 2006   (JP)   ............................ 2006-280401

(51) Int. Cl.
*H03B 5/02* (2006.01)
*H03B 5/18* (2006.01)
(52) U.S. Cl. ................. 331/177 V; 331/96; 331/117 D; 331/175
(58) Field of Classification Search ............... 331/36 C, 331/96, 107 DP, 117 R, 117 FE, 117 D, 175, 331/177 R, 177 V See application file for complete search history.

(56) References Cited

U.S. PATENT DOCUMENTS 4,868,526 A * 9/1989 Camiade et al. ........ 331/117 FE

FOREIGN PATENT DOCUMENTS

| JP | 6-45826 A | 2/1994 |
|---|---|---|
| JP | 6-326604 A | 11/1994 |
| JP | 8-256016 A | 10/1996 |
| JP | 2001-7649 A | 1/2001 |
| JP | 2001-352218 A | 12/2001 |
| JP | 2002-50774 A | 2/2002 |
| JP | 2004-320664 A | 11/2004 |

* cited by examiner

*Primary Examiner*—David Mis
(74) *Attorney, Agent, or Firm*—Sughrue Mion, PLLC

(57) ABSTRACT

An object of the present invention is to provide a voltage controlled oscillator in a microwave band without narrowing the variable frequency range and having improved phase noise characteristics. This invention is a voltage controlled oscillator in the microwave band which controls an oscillation frequency by a varactor diode, a varactor diode circuit in which a plurality of series-connected circuits having the varactor diode and a capacitance connected in series are connected in parallel and the varactor diodes include at least one or more GaAs varactor diodes of the HyperAbrupt type and at least one or more Si varactor diodes of the Abrupt type.

12 Claims, 5 Drawing Sheets

VOLTAGE CONTROLLED OSCILLATOR AND ITS CONTROL METHOD

This application is based upon and claims the benefit of priority from Japanese patent application No. 2006-280401, filed on Oct. 13, 2006, the disclosure of which is incorporated herein in its entirety by reference.

BACKGROUND OF THE INVENTION

1. Field of the Invention

The present invention relates to a voltage controlled oscillator.

2. Description of the Related Art

A voltage controlled oscillator is disclosed in Japanese Patent Application Laid-Open No. 2004-320664. Japanese Patent Application Laid-Open No. 2004-320664 discloses that a variable frequency amplitude is enlarged without degradation of phase noise characteristics, by including: a varactor diode circuit in which a plurality of circuits having a varactor diode and an open stub connected in series are connected in parallel; and a plurality of control circuits for independently applying a control voltage to each varactor diode in the varactor diode circuit, and by variably controlling control voltages independently applied to each varactor diode to one of them in turn in a range from their lower limit to upper limit, in order to control compound capacitance of the varactor diode circuit in the entire variable range thereof.

Because of recent adoption of a multivalued modulation system involved in higher-capacitance radio communication system and the like, requirements for the signal source of the communication signal have become stricter. In particular, because quality of communication is higher, phase noise characteristics of a local oscillator (LO) signal which is the signal source have become a very important element.

In radio communication, as the signal source, a voltage controlled oscillator (hereinafter, called "VCO") controlled with PLL (Phase Locked Loop) is generally used. FIG. 1 shows the waveform spectrum of an LO signal outputted from a local oscillator used in a PLL circuit constituting a radio system. The PLL circuit has a general configuration which includes the local oscillator, a phase comparator, a loop filter, a variable frequency divider and a voltage controlled oscillator controlled with PLL.

Among the waveforms shown in FIG. 1, a waveform in area 51 is compressed by PLL, and its value and range are determined by characteristics of the loop filter constituting the PLL circuit.

Area 52 is where the 1/f noise of a semiconductor becomes dominant, and area 53 is where a Q value (quality factor: a parameter relating to a loss of a resonant circuit, as the loss becomes less, the Q value becomes larger) of a circuit including a resonator starts to become dominant, and it is necessary to design a circuit configuration of the signal source so as to improve this.

As for a variable element used as a basis for controlling the frequency in the VCO, change in capacitance of a varactor diode is often used. Such varactor diode often used in an oscillator in a microwave band is as follows:

1. GaAs of HyperAbrupt Type
2. Si of Abrupt Type

The most suitable diode that is used is selected based upon its operational physical characteristics.

A GaAs varactor diode of HyperAbrupt type has a large capacitance change ratio and a small series resistance Rs. As a result, when is used in an oscillation circuit, a higher Q value can be provided. However, because of large change in impurity concentration on a joint surface, a lattice defect or an interface state is likely to occur, resulting in larger 1/f noise.

On the one hand, because a Si varactor diode of the Abrupt type has a small capacitance change ratio and a small series resistance Rs, when it is used in the oscillation circuit, a Q value tends to be smaller. However, compared to the HyperAbrupt type, because of a smaller change in impurity concentration on a joint surface, the 1/f noise is lower.

The GaAs varactor diode of HyperAbrupt type has a larger capacitance change ratio and better linear capacitance change during application of the voltage which therefore makes it easier to design for use in an oscillation circuit. However, degradation of a phase noise is likely to occur due to the effect caused by 1/f noise.

Further, when a Si varactor diode of the Abrupt type is selected to improve 1/f noise, degradation of phase noise characteristics may be caused due to a decrease in the variable frequency range caused by the small capacitance change ratio, and the low Q value.

It is difficult to improve by circuit design, because the influence of device characteristics dominates all these problems. Moreover, it is very hard to conduct a trade-off, which makes the circuit design including device selection complicated.

Concerning the element of a resonator in the voltage controlled oscillator, there may be a corner frequency fc. The corner frequency fc is a frequency which is an inflection point of phase noise characteristics, and in a frequency range that is not higher than the corner frequency fc, the effect of 1/f noise becomes a dominant factor for determining phase noise characteristics. In a frequency range that is not lower than the corner frequency fc, the Q value of the resonator circuit becomes a dominant factor for determining the phase noise characteristics.

A VCO using a varactor diode having a wide, variable frequency range has its phase noise characteristics determined by characteristics of the varactor diode which is the variable element. In order to enlarge the variable frequency range, a GaAs varactor diode of the HyperAbrupt type having a large capacitance change ratio is used. In this case, a problem arises in which degradation of phase noise characteristics becomes significant, due to the effect caused by the 1/f noise of the varactor diode, in a range that is not higher than a corner frequency fc.

SUMMARY OF THE INVENTION

An object of the present invention is to provide a voltage controlled oscillator in a microwave band without narrowing the variable frequency range and with improvement in phase noise characteristics.

The voltage controlled oscillator in the microwave band of the present invention is a voltage controlled oscillator in the microwave band which controls an the oscillation frequency by a varactor diode circuit, in which a plurality of series-connected circuits having the varactor diode and a capacitance connected in series are connected in parallel, and the varactor diode includes at least one or more GaAs varactor diodes of the HyperAbrupt type and at least one or more Si varactor diodes of the Abrupt type.

The present invention configured as described above has an advantage in which phase noise characteristics in an offset frequency range that is not higher than a corner frequency fc can be improved without narrowing the variable frequency range, by taking a configuration in which a Si varactor diode of the Abrupt type having a small 1/f noise and a GaAs varactor diode of the HyperAbrupt type having a large capacitance change ratio are used in a parallel connection in a circuit whose resonator portion (varactor diode circuit) constitutes the voltage controlled oscillator in the microwave band.

DETAILED DESCRIPTION OF THE PREFERRED EMBODIMENT

Next, an exemplary embodiment of the present invention will be described with reference to the accompanying drawings.

Figure 1:
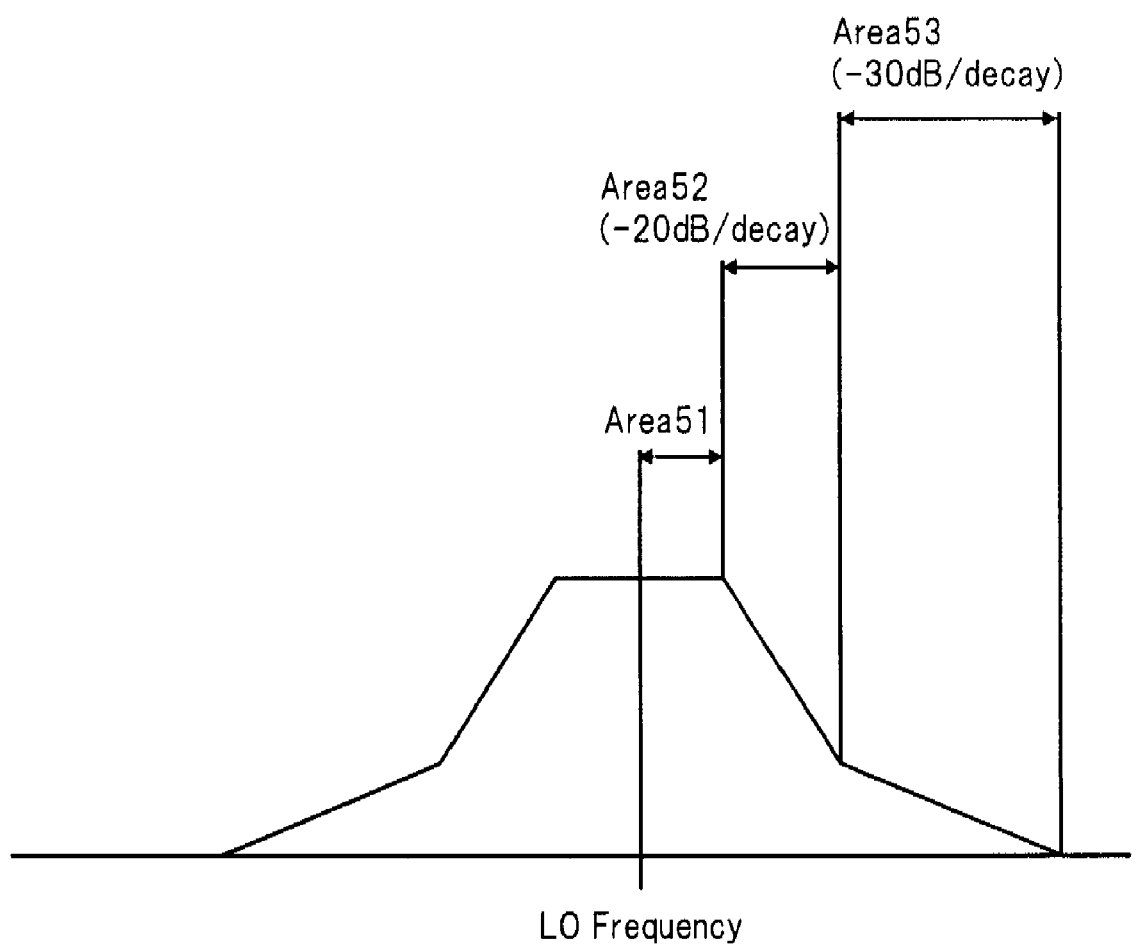
FIG. 1 is a view illustrating a waveform spectrum of an LO signal outputted from a local oscillator used in a PLL circuit constituting a radio system.
Figure 2:
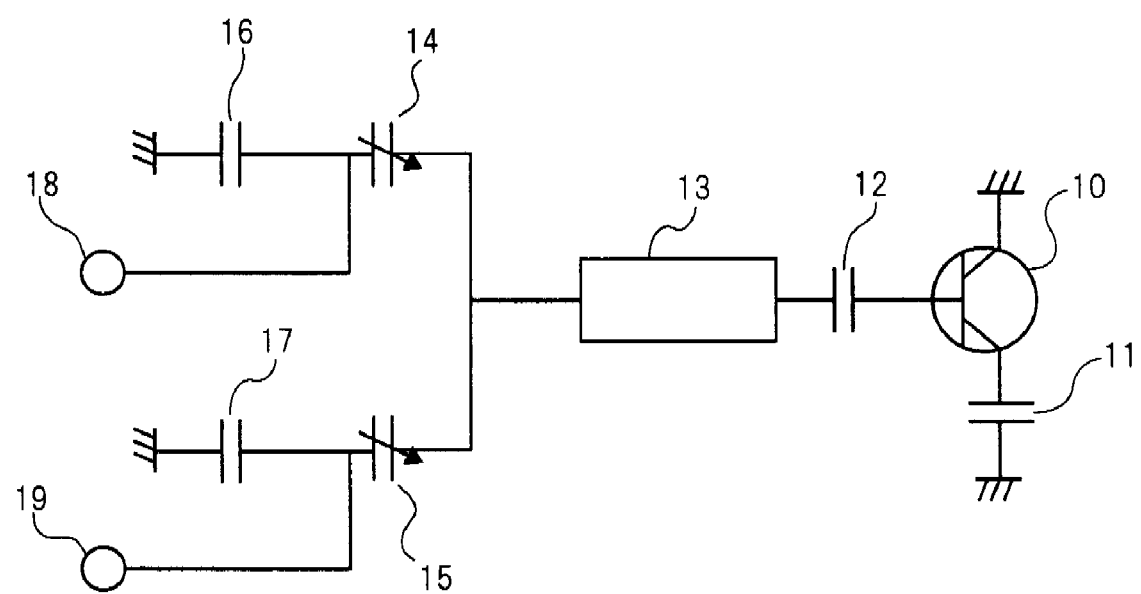
FIG. 2 is a circuit diagram illustrating a configuration of a first exemplary embodiment of the present invention.

FIG. 2 is a circuit diagram illustrating a configuration of one exemplary embodiment of a voltage controlled oscillator (VCO) in a microwave band according to the present invention.

The VCO in the microwave band of the present exemplary embodiment includes oscillating transistor 10 as an active element for oscillation, load capacitance 11 provided on the side of an emitter electrode of oscillating transistor 10, capacitance 16, 17, varactor diodes 14, 15, which have variable capacitance, respectively connected to capacitance 16, 17 in series, connecting capacitance 12, and line 13.

Capacitance 16 and varactor diode 14, and capacitance 17 and varactor diode 15 connected in series are connected to each other in parallel on the side of varactor diodes 14, 15, and connected to the base electrode of oscillating transistor 10 through line 13 and coupling capacitance 12. Further, the connection point of capacitance 16 and varactor diode 14, and the connection point of capacitance 17 and varactor diode 15 are ports 18, 19, respectively.

In the present exemplary embodiment, based on NR (negative resistance) characteristics determined by oscillating transistor 10 and its load capacitance 11, a resonator is formed of connecting capacitance 12, line 13, varactor diodes 14, 15, and capacitance 16, 17.

Ports 18, 19 are supply ports for applying DC voltages to varactor diodes 14, 15, respectively, and joined so that a resonator circuit is not affected in the RF mode. In FIG. 2, a DC bias supply circuit to oscillating transistor 10 is omitted. The DC bias supply circuit to oscillating transistor 10 is also connected such that it will not be affected in the RF mode. The circuit described above forms an oscillator.

For oscillating transistor 10, a Si bipolar transistor etc. having sufficient NR (negative resistance) characteristics at an oscillation frequency and having a low level of low-frequency noise is used. Connecting capacitance 12 and line 13, along with varactor diodes 14, 15, are factors for determining oscillation frequency.

In particular, connecting capacitance 12 and line 13 are determined depending on an the oscillation frequency band where a VCO is used. Connecting capacitance 12 is also determined by the relationship between a required, variable frequency range, the capacitance change ratio of varactor diodes 14, 15 and capacitance 16, 17.

For varactor diode 14, a GaAs varactor diode of the HyperAbrupt type having a large ratio capacitance change ratio is used so as to enlarge the variable range width.

For varactor diode 15, a Si varactor diode of the Abrupt type having low 1/f noise is used to improve phase noise characteristics in the vicinity of an oscillation signal.

Figure 3:
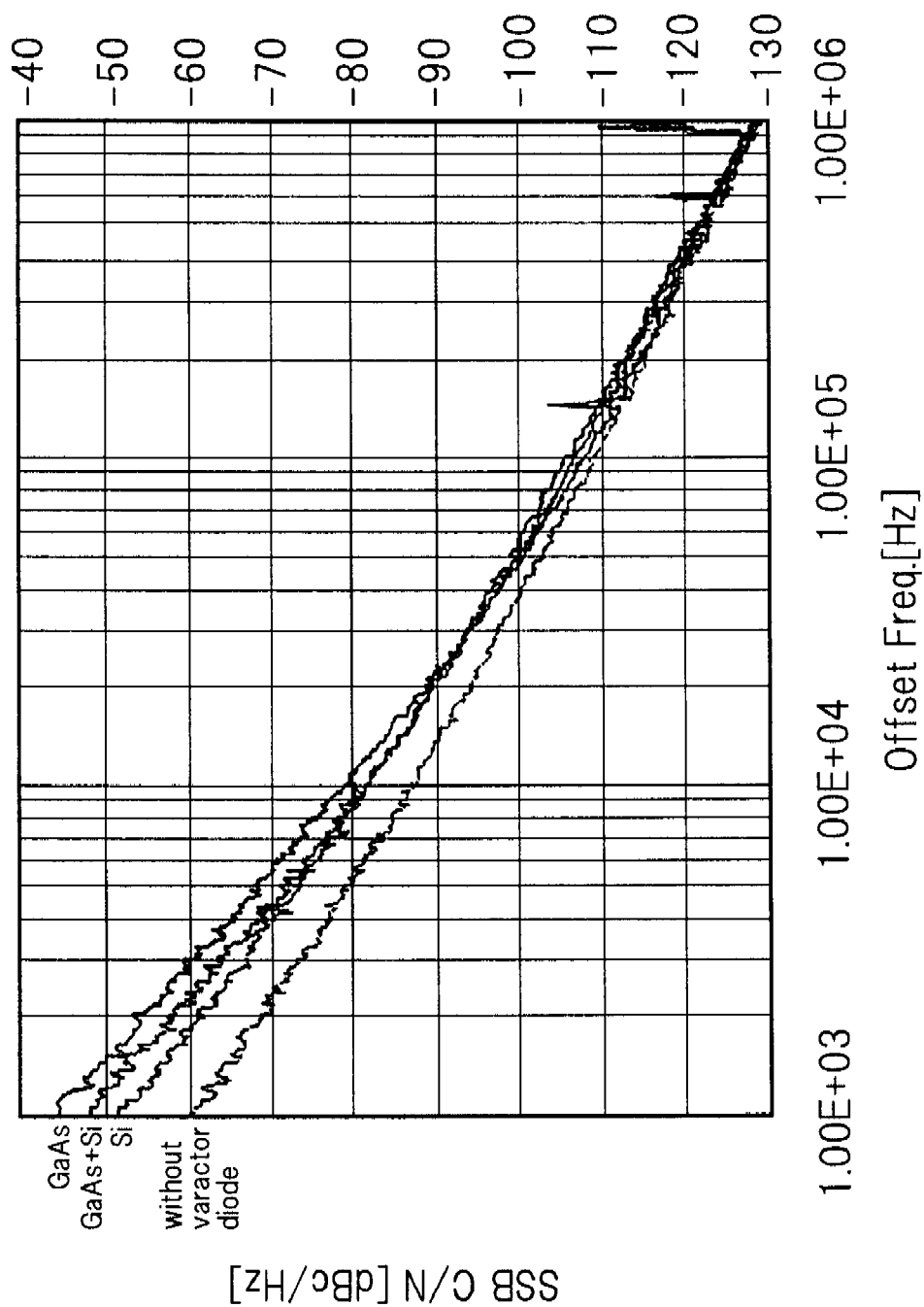
FIG. 3 is a view illustrating the result from comparing phase noise characteristics obtained from the component configuration of the exemplary embodiment shown in FIG. 2.
Figure 4:
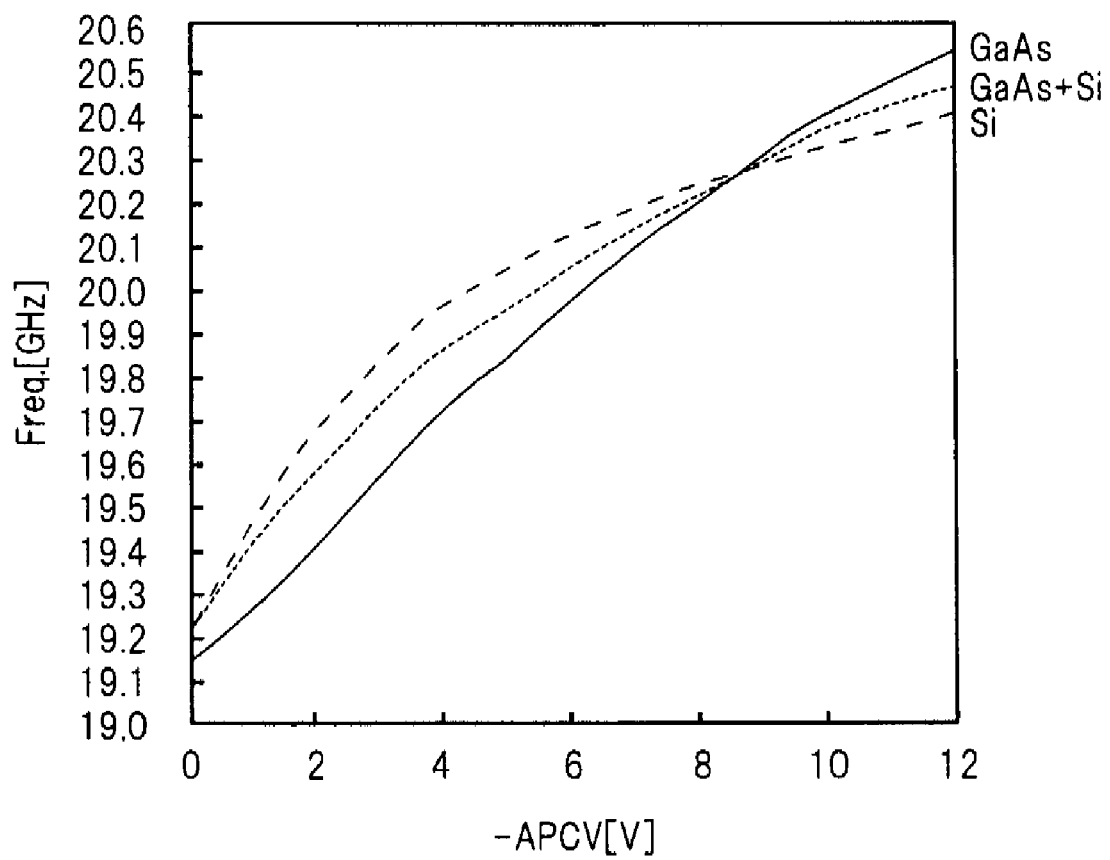
FIG. 4 is a view illustrating comparison of an f-V curve (frequency vs. control voltage) obtained from the component configuration of the exemplary embodiment shown in FIG. 2.

FIGS. 3, 4 illustrate comparison of characteristics of the oscillation circuit of the present exemplary embodiment with that of another oscillation circuit.

FIG. 3 is a view illustrating the result from comparing the phase noise characteristics obtained from the component configuration, and the CN ratio (Carrier to Noise ratio) characteristics of a single sideband (SSB) to an offset frequency.

In FIG. 3, respectively, characteristics designated by "GaAs" are characteristics when GaAs varactor diodes of the HyperAbrupt type are used for both varactor diodes 14, 15, characteristics designated by "Si" are characteristics when Si varactor diodes of the Abrupt type are used for both varactor diodes 14, 15, and characteristics designated by "GaAs+Si" are characteristics when the configuration of the present exemplary embodiment is used. Characteristics designated by "without varactor diode" are characteristics when, instead of varactor diodes 14, 15, fixed capacitances are used to form an oscillation circuit having a fixed frequency.

In each configuration, for oscillating transistor 10, load capacitance 11, and line 13, the component having the same configuration is used, respectively. Connecting capacitance 12 and capacitance 16, 17 are adjusted to provide a comparable oscillation frequency and variable frequency range. Further, ports 18, 19 are connected externally to apply the same potential.

In the case of "without varactor diode", the phase noise characteristics are determined by oscillating transistor 10 and line 13 the constitute the resonator, and show better characteristics than those of any cases in which varactor diode are used. Therefore, it is thought that a dominant part of the difference of the phase noise characteristics between each circuit is generated by the difference in the varactor diode.

Referring to FIG. 3, comparing the characteristics of "GaAs" with the characteristics of "Si", in the case of "GaAs", a phenomenon of abrupt degradation of the phase noise characteristics is observed in an offset frequency range that is not higher than the corner frequency fc described above.

The Si varactor diode of the Abrupt type, compared to the GaAs varactor diode of the HyperAbrupt type, has a lower corner frequency fc and further, absolutely smaller 1/f noise content, and then has better phase noise characteristics in the vicinity up to several dozen KHz.

On the contrary, in a region that is not lower than several dozen KHz where the Q value starts to become dominant, because GaAs has a lower resistance than Si as bulk material, Rs (series resistance component in an equivalent circuit) of the varactor diode is small, and because a GaAs varactor diode of the HyperAbrupt type has a larger capacitance change ratio, if in the same, variable frequency range, the connecting capacitance of a resonator can be made smaller, thereby the effect caused by Rs of the varactor diode can be reduced. Accordingly, phase noise characteristics are superior in cases where the GaAs varactor diode of the HyperAbrupt type is used to cases where the Si varactor diode of the Abrupt type is used.

Compared to cases where the GaAs varactor diode of the HyperAbrupt type and a Si varactor diode of the Abrupt type are used in parallel, as in the present exemplary embodiment, it is possible to have midpoint phase noise characteristics. Because phase noise characteristics in an actual communication system are affected by an integrated value in a frequency region, it is necessary to improve the phase noise characteristics in the entire, offset frequency region of an oscillation signal waveform.

At this time, when a varactor diode of one type is used, the direction of improvement is restricted by the limitation of its physical characteristics, but as in the present exemplary embodiment, when varactor diodes of different type are used in parallel, it is possible to improve the phase noise characteristics in the entire, offset frequency region.

FIG. 4 shows comparison of f-V curves (frequency vs. control voltage) provided from the component configurations.

Compared to a case where the GaAs varactor diode of the HyperAbrupt type is used, the linearity of the f-v curve is inferior in cases where the Si varactor diode of the Abrupt type is used. A gradient of the f-V curve is modulation sensitivity of a VCO, and then the inferior linearity of the f-V curve indicates that a large change in the modulation sensitivity was caused by a control voltage.

Because the modulation sensitivity affects loop characteristics of a PLL, when a VCO using a PLL is used, the loop characteristics are not kept constant if the modulation sensitivity is not constant, so that even if a PLL control circuit is used, the waveform of the oscillation signal is not kept constant. When a VCO signal controlled by a PLL control circuit is used as an LO signal in a communication system, it is necessary that the characteristics of the VCO signal be strictly specified as regards the waveform, because waveform characteristics thereof determine the quality of the communication system. Therefore, the VCO whose modulation sensitivity is largely changed becomes unsuitable for an LO signal source.

When the configuration of the present exemplary embodiment is used, the linearity of the f-V curve exhibits intermediate phase noise characteristics of a case in which the GaAs of the HyperAbrupt type is used, and a case in which the Si of the Abrupt type is used. Therefore, while controlling the adverse effect caused by a change in modulation sensitivity to the minimum, the present invention can also provide improvement in the phase noise characteristics.

In an actual application, adjusting capacitance 16, 17 can determine which of GaAs varactor diode 14 and Si varactor diode 15 forms the dominant phase noise characteristics. Capacitance 16, 17 can be formed of an open stub in a microwave band circuit, and further a stub length of the open stub may be used to finely adjust, which allows for easier adjustment to realize desired characteristics.

Figure 5:
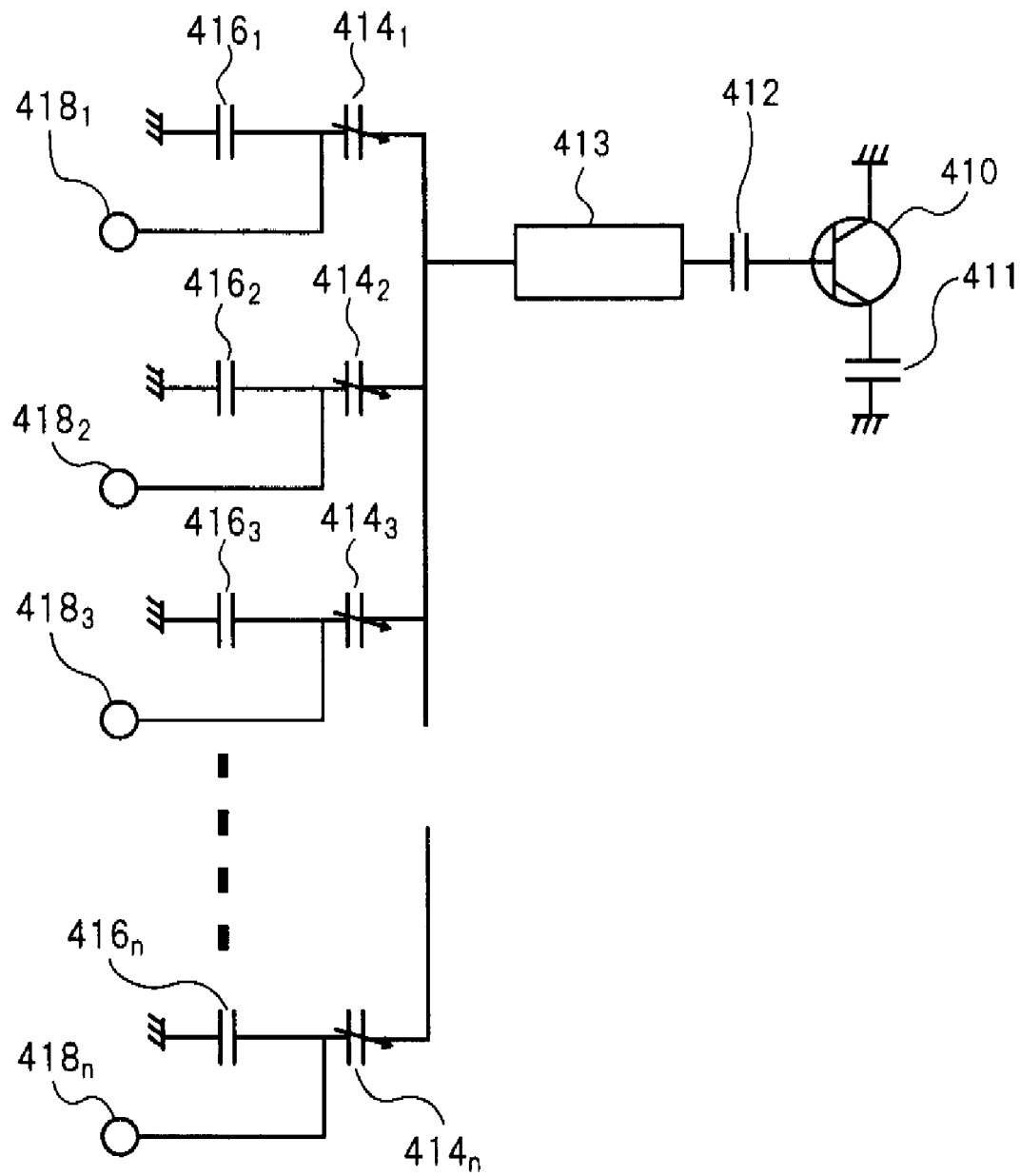
FIG. 5 is a circuit diagram illustrating a configuration of a second exemplary embodiment of the present invention.

FIG. 5 is a circuit diagram illustrating a configuration of a second exemplary embodiment of the present invention.

Oscillating transistor 410, load capacitance 411, connecting capacitance 412, and line 413 in FIG. 5 are similar to oscillating transistor 10, load capacitance 11, connecting capacitance 12, and line 13 shown in FIG. 2, respectively.

In the present exemplary embodiment, also, a capacitance and a varactor diode connected in series are connected on the side of the varactor diode to line 413, and in the exemplary embodiment shown in FIG. 2, the two sets of the capacitance and the varactor diode are connected to each other in parallel, on the other hand, in the present exemplary embodiment, n sets composed of capacitance $416_1, 416_2, 416_3, \ldots, 416_n$, and varactor diodes $414_1, 414_2, 414_3, \ldots, 414_n$ are connected in parallel. Connection points of the respective capacitance and the varactor diodes are ports $418_1, 418_2, 418_3, \ldots, 418_n$, respectively.

In the present exemplary embodiment, depending on the number n of resonator portions connected in parallel, a variable frequency range is divided into a plurality of frequency regions, and voltages applied to ports $418_1, 418_2, 418_3, \ldots, 418_n$ corresponding to a region from a low-frequency to a high-frequency are controlled in turn to increase from their individual minimum to maximum.

By using the configuration described above, adjustment of the variable frequency range and the phase noise characteristics can be made to meet more complicated requirements, and by exercising control as described above, an increase in modulation sensitivity with respect to enlargement of the variable frequency range can be better controlled, resulting in more suppressed degradation of the phase noise characteristics.

In addition, in each of the exemplary embodiments described above phase noise, characteristics whatever varactor diode becomes the dominant diode can be adjusted by the capacitance connected to the rear side of the individual varactor diode.

"While the invention has been particularly shown and described with reference to exemplary embodiments thereof, the invention is not limited to these embodiments. It will be understood by those ordinarily skilled in the art that various changes in form and details may be made therein without departing from the spirit and scope of the present invention as defined by the claims."

What is claimed is:

1. A voltage controlled oscillator, comprising:
    a varactor diode circuit in which a plurality of series-connected circuits each having a varactor diode and a capacitance connected in series are connected in parallel, wherein
    one or more of the varactor diodes is a GaAs varactor diode of the HyperAbrupt type, and one or more of the other varactor diodes is a Si varactor diode of the Abrupt type.

2. The voltage controlled oscillator according to claim 1, further comprising:
    an active element;
    a first capacitance connected to an output electrode of the active element;
    a second capacitance, one end of which is connected to a control electrode of the active element; and
    a line, one end of which is connected to the other end of the second capacitance, and the other end of which is connected to a terminal of the varactor diode circuit on the side of the varactor diode.

3. The voltage controlled oscillator according to claim 1, further comprising:
    ports which applied voltage and which are located on the connected point of said varactor diode and said capacitance of said series-connected circuits.

4. The voltage controlled oscillator according to claim 2, further comprising:
    ports which applied voltage and which are located on the connected point of said varactor diode and said capacitance of said series-connected circuits.

5. The control method using the voltage controlled oscillator according to claim 3, comprising:
    depending on the number n of resonator portions connected in parallel, a variable frequency range is divided into a plurality of frequency regions, and voltages that are applied to said ports that correspond to a regions having a low-frequency to a high-frequency range, are controlled in turn to individually increase from a minimum to a maximum voltage.

6. The control method using the voltage controlled oscillator according to claim 4, comprising:

depending on the number n of resonator portions connected in parallel, a variable frequency range is divided into a plurality of frequency regions, and voltages that are applied to said ports that correspond to a regions having a low-frequency to a high-frequency range, are controlled in turn to individually increase from a minimum to a maximum voltage.

7. A voltage controlled oscillator, comprising:

a varactor diode circuit in which a plurality of series-connected circuits each having a varactor diode and a capacitance connected in series are connected in parallel, wherein one or more of the varactor diodes is HyperAbrupt type having a large capacitance change ratio compared with the other varactor diodes, and one or more of the other varactor diodes is a Abrupt type having a lower 1/f noise.

8. The voltage controlled oscillator according to claim 7, further comprising:

an active element;

a first capacitance connected to an output electrode of the active element;

a second capacitance, one end of which is connected to a control electrode of the active element; and a line, one end of which is connected to the other end of the second capacitance, and the other end of which is connected to a terminal of the varactor diode circuit on the side of the varactor diode.

9. The voltage controlled oscillator according to claim 7, further comprising:

ports which applied voltage and which are located on the connected point of said varactor diode and said capacitance of said series-connected circuits.

10. The voltage controlled oscillator according to claim 8, further comprising:

ports which applied voltage and which are located on the connected point of said varactor diode and said capacitance of said series-connected circuits.

11. The control method using the voltage controlled oscillator according to claim 9, comprising:

depending on the number n of resonator portions connected in parallel, a variable frequency range is divided into a plurality of frequency regions, and voltages that are applied to said ports that correspond to a regions having a low-frequency to a high-frequency range, are controlled in turn to individually increase from a minimum to a maximum voltage.

12. The control method using the voltage controlled oscillator according to claim 10, comprising:

depending on the number n of resonator portions connected in parallel, a variable frequency range is divided into a plurality of frequency regions, and voltages that are applied to said ports that correspond to a regions having a low-frequency to a high-frequency range, are controlled in turn to individually increase from a minimum to a maximum voltage.

\* \* \* \* \*